(12) United States Patent
Shimamura et al.

(10) Patent No.: US 8,106,722 B2
(45) Date of Patent: Jan. 31, 2012

(54) MULTI-LAYERED DEVICE AND ELECTRONIC EQUIPMENT USING THEREOF

(75) Inventors: Tetsuro Shimamura, Kyoto (JP); Michael Hoeft, Asendorf (DE)

(73) Assignee: Panasonic Corporation, Osaka (JP)

( * ) Notice: Subject to any disclaimer, the term of this patent is extended or adjusted under 35 U.S.C. 154(b) by 356 days.

(21) Appl. No.: 12/544,414

(22) Filed: Aug. 20, 2009

(65) Prior Publication Data

US 2010/0045405 A1    Feb. 25, 2010

(30) Foreign Application Priority Data

Aug. 20, 2008    (JP) .................................. 2008-211474

(51) Int. Cl.
    *H01H 7/00*    (2006.01)
(52) U.S. Cl. ........................................................ 333/185
(58) Field of Classification Search .................. 333/185, 333/184, 167
    See application file for complete search history.

(56) References Cited

U.S. PATENT DOCUMENTS

| 5,945,892 A | 8/1999 | Kato et al. |
| 2009/0033441 A1 | 2/2009 | Saito et al. |
| 2010/0225420 A1* | 9/2010 | Tanaka et al. .................. 333/185 |

FOREIGN PATENT DOCUMENTS

| JP | 9-238040 | 9/1997 |
| JP | 2007-123678 | 5/2007 |
| WO | 2006/109465 | 10/2006 |

* cited by examiner

*Primary Examiner* — Stephen Jones
(74) *Attorney, Agent, or Firm* — Wenderoth, Lind & Ponack, LLP

(57) ABSTRACT

A multi-layered device includes an inductor electrode layer connected between one end of a first viahole inductor conductor and a side-surface ground electrode, and arranged substantially in parallel to a dielectric sheet, when the first and second viahole inductor conductors are arranged in such a positional relation that a distance between the first and second viahole inductor conductors is smaller than 1.5 times a length of the first viahole inductor conductor.

12 Claims, 8 Drawing Sheets

MULTI-LAYERED DEVICE AND ELECTRONIC EQUIPMENT USING THEREOF

BACKGROUND OF THE INVENTION

1. Field of the Invention

The present invention relates to a multi-layered device including a plurality of multi-layered insulator layers, and an electronic equipment that employs the multi-layered device.

2. Description of the Related Art

Conventionally, there have been proposed various multi-layered devices including multi-layered ceramic insulators and a plurality of resonators built in the layered ceramic insulators. Referring to FIGS. 9 and 10, a multi-layered device according to a prior art will be described below. FIG. 9 is an exploded perspective view of the multi-layered device according to the prior art. In addition, FIG. 10 is a sectional schematic view (a sectional view along a line B-B' of FIG. 9) of the multi-layered device according to the prior art. It is noted that the common components are denoted by the same reference numerals.

Referring to FIGS. 9 and 10, reference numerals 901, 902, 903, 904 and 905 denote dielectric sheet layers, and an insulator 920 is constituted by multi-layering these layers. The multi-layered device includes ground electrode layers 906 and 907 arranged inside or on the surfaces of the insulator 920, substantially in parallel to the dielectric sheet layer 901, side-surface ground electrodes 912 and 913 arranged on the side surfaces of the insulator, and a plurality of resonators 921 and 922 formed in the insulator. A first resonator 921, which is one of the plurality of resonators, includes a first capacitive electrode layer 908 arranged substantially in parallel to the dielectric sheet layer 904, and a first viahole inductor conductor 914 which has one end connected to the first capacitive electrode layer 908 and is arranged to be substantially perpendicular to the dielectric sheet layer 904.

It is noted that the first viahole inductor conductors 914a and 914b of FIG. 9 are connected to each other in a shape of one straight line to constitute a first viahole inductor conductor 914 as shown in FIG. 10. In addition, a second resonator 922, which is another one of the plurality of resonators 921 and 922, includes a second capacitive electrode layer 909 arranged substantially in parallel to the dielectric sheet layer 904, and a second viahole inductor conductor 915, which has one end connected to the second capacitive electrode layer 909 and is arranged to be substantially perpendicular to the dielectric sheet layer 904. It is noted that the viahole inductor conductors 915a and 915b of FIG. 9 are connected to each other in a shape of one straight line to constitute a second viahole inductor conductor 915 as shown in FIG. 10.

The dielectric sheet 903 is sandwiched between (a) capacitive coupling electrodes 910 and 911 and (b) the first capacitive electrode layer 908 and the second capacitive electrode layer 909, and the capacitive coupling electrodes 910 and 911 are opposed to the first capacitive electrode layer 908 and the second capacitive electrode layer 909, so as to form a capacitor and to capacitively couple the plurality of resonators 921 and 922. By appropriately adjusting a combination of the capacitance of this capacitor, and a coupling coefficient value of the magnetic coupling between the first viahole inductor conductor 914 and the second viahole inductor conductor 915, desired characteristics can be obtained. It is noted that the Japanese patent laid-open publication No. JP-9-238040-A has been known as a prior art reference document relevant to the present invention.

However, the above-mentioned multi-layered device according to the prior art has such a problem that the reduction in the height of the multi-layered device results in a large insertion loss, and desired characteristics cannot be obtained when the multi-layered device is made smaller, since the magnetic coupling between the resonators becomes too strong due to a narrowed interval between the resonators. Namely, there is such a problem that the magnetic coupling becomes strong particularly when a distance between the first and second viahole inductor conductors is shorter than 1.5 times the length of the first viahole inductor conductor.

The self-inductance of a linear conductor having a radius "a" and a length "l" can be obtained by the following Equation (1), and a mutual inductance between two linear conductor having a center-to-center distance "d" can be obtained by the following Equation (2):

$$L = \frac{\mu 0}{2\pi}\left(l\log\left(\frac{1+\sqrt{a^2+l^2}}{a}\right) - \sqrt{a^2+l^2} + a\right) \quad (1)$$

$$M = \frac{\mu 0}{2\pi}\left(l\log\left(\frac{1+\sqrt{d^2+l^2}}{a}\right) - \sqrt{d^2+l^2} + d\right) \quad (2)$$

According to the Equations (1) and (2), when the radius "a" is set to 0.04 mm, the length "l" is set to 0.45 mm, and the distance "d" is set to 0.9 mm, the self-inductance becomes 0.2433 nH, mutual inductance becomes 0.022 nH, then the coupling coefficient becomes 0.091. Using these setting values, it was tried to design a filter for a wireless LAN having a bandwidth of 100 MHz at a center frequency of 2.45 GHz. In this case, the designing was performed by using an equivalent circuit based on the construction of FIGS. 9 and 10. As a result, a satisfactory characteristic as shown in FIG. 11 was obtained. In this case, the insertion loss within the band was 2.3 dB, the attenuation was 30 dB at a frequency of 1990 MHz outside of the band, and the minimum attenuation of 45 dB was obtained at a frequency of equal to or smaller than 1800 MHz.

However, when the distance "d" is set to 0.89×l, namely, when the distance "d" is set to 0.4 mm so as to reduce the size of the multi-layered device, the mutual inductance becomes 0.047 nH, and the coupling coefficient becomes 0.192. FIG. 12 shows characteristics when filter designing having specifications similar to those mentioned above is attempted by the method which is the same as the method mentioned above. It can be understood that the attenuation at the frequency of equal to or smaller than 1800 MHz becomes a minimum value of 33 dB leading to remarkable deterioration in the power transmission although the insertion loss has a satisfactory value of 2.2 dB.

Conversely, when it is tried to secure a sufficient attenuation in this frequency range, the characteristics in the passband is significantly deformed, and the insertion loss becomes larger than 3 dB. In addition, the impedance matching is also worsened, and this leads to degraded usability as a filter. As described above, the narrowed interval between the resonators inevitably causes the stronger magnetic coupling and deterioration in the performance, and this leads to a serious hindrance to promoting the size reduction.

SUMMARY OF THE INVENTION

In view of the above mentioned circumstances, it is an object of the present invention to suppress the deterioration in the characteristics of a multi-layered device including a plurality of resonators.

In order to achieve the above described object, the multi-layered device according to the present invention is characterized by including an inductor electrode layer connected between another end of a first viahole inductor conductor and a side-surface ground electrode, and arranged substantially in parallel to a dielectric sheet, when the first and second viahole inductor conductors are arranged in such a positional relation that a distance between the first and second viahole inductor conductors is smaller than 1.5 times a length of the first viahole inductor conductor.

According to the multi-layered device according to the present invention, the length of the first viahole inductor conductor can be shortened by providing the inductor electrode layer arranged substantially in parallel to the dielectric sheet layer, and, as a result, it is possible to suppress the magnetic coupling between the first and second viahole inductor conductors.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
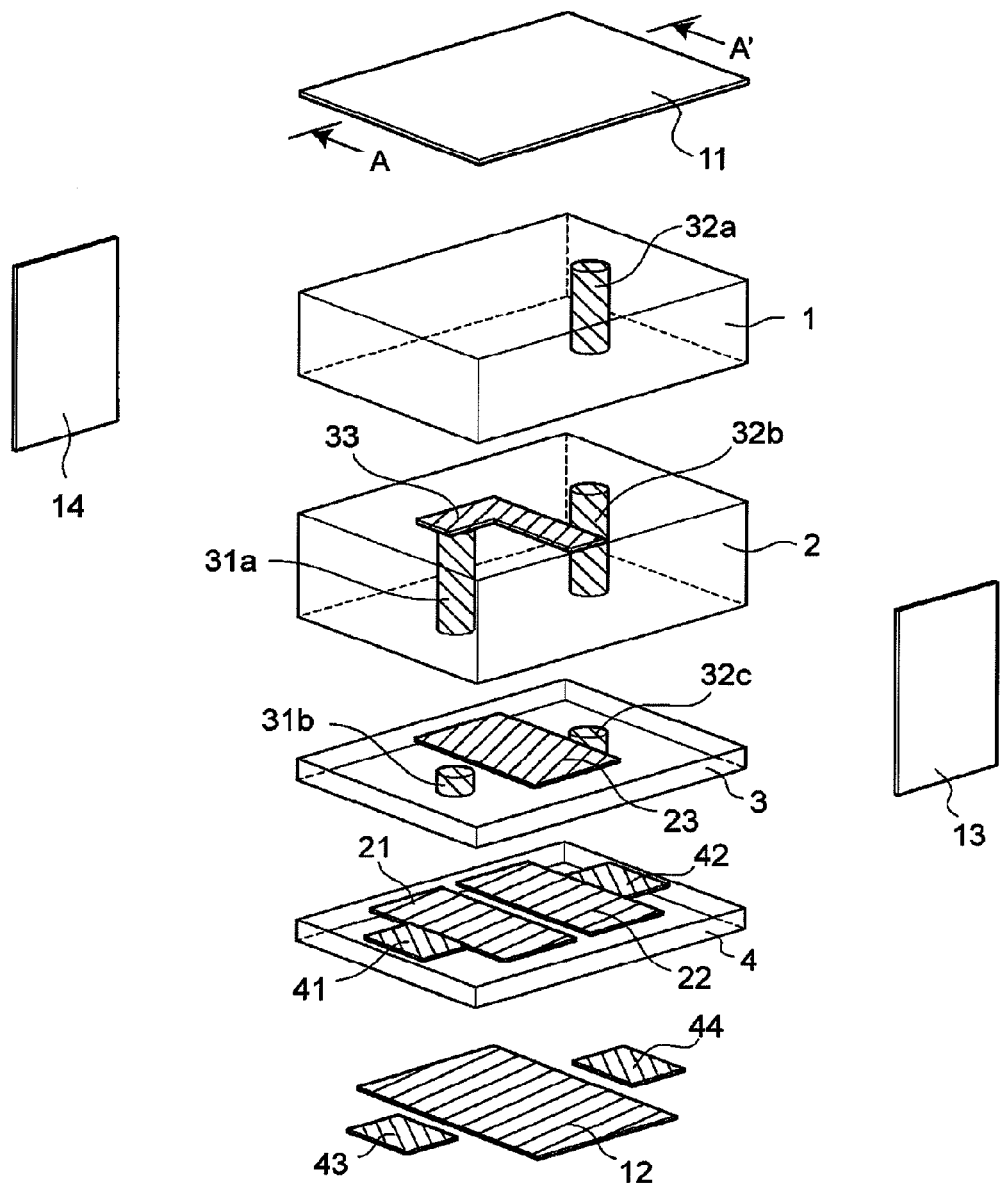
FIG. 1 is an exploded perspective view of a multi-layered device according to a preferred embodiment of the present invention.

Preferred embodiments of the present invention will be described below with reference to the drawings. Components similar to each other are denoted by the same reference numerals and will not be described herein in detail.

First Preferred Embodiment

Figure 2:
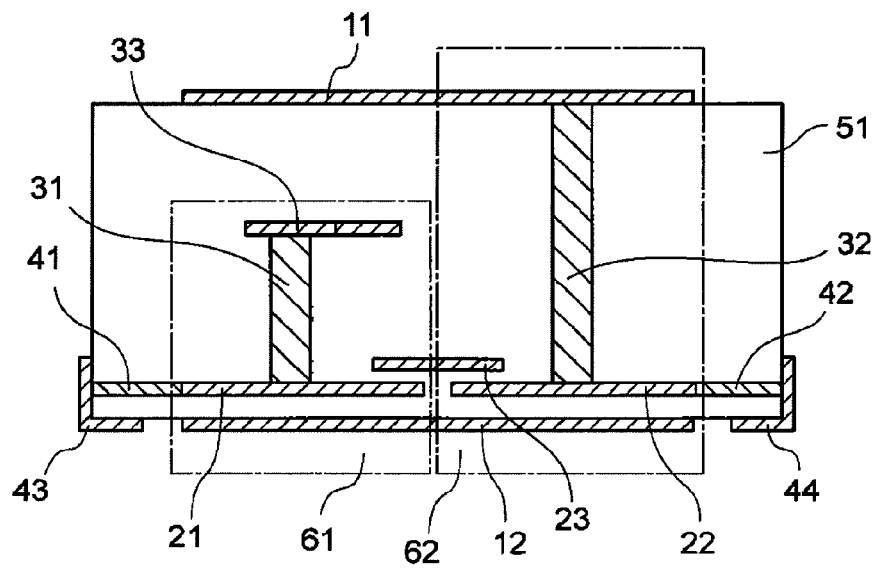
FIG. 2 is a sectional schematic view (a sectional view along a line A-A' of FIG. 1) of the multi-layered device according to the present preferred embodiment of the invention.

A multi-layered device according to a first preferred embodiment will be described below with reference to FIGS. 1 and 2. FIG. 1 is an exploded perspective view of the multi-layered device according to the first preferred embodiment of the present invention. In addition, FIG. 2 is a sectional schematic view (a sectional view along a line A-A' of FIG. 1) of the multi-layered device according to the first preferred embodiment.

The multi-layered device according to the first preferred embodiment includes an insulator 51 including a plurality of multi-layered dielectric sheet layers 1, 2, 3 and 4, ground electrode layers 11 and 12 arranged substantially in parallel to the dielectric sheet layer 1, inside or on the surfaces of the insulator 51, side-surface ground electrodes 13 and 14 arranged on mutually opposite side surfaces of the insulator 51, and a plurality of resonators 61 and 62 formed in the insulator 51. The first resonator 61, which is one of the plurality of resonators 61 and 62, includes a first capacitive electrode layer 21 arranged substantially in parallel to the dielectric sheet layer 4, and a first viahole inductor conductor 31 that has one end connected to the first capacitive electrode layer 21 and is arranged to be substantially perpendicular to the dielectric sheet layer 4.

The viahole inductor conductors 31a and 31b of FIG. 1 are connected to each other in a shape of one straight line so as to constitute the first viahole inductor conductor 31. The second resonator 62, which is another one of the plurality of resonators 61 and 62, includes a second capacitive electrode layer 22 arranged substantially in parallel to the dielectric sheet layer 4, and a second viahole inductor conductor 32 that has one end connected to the second capacitive electrode layer 22 and is arranged to be substantially perpendicular to the dielectric sheet layer 4.

The viahole inductor conductors 32a, 32b and 32c of FIG. 1 are connected to each other in a shape of one straight line so as to constitute the second viahole inductor conductor 32. In addition, the dielectric sheet 3 is sandwiched between (a) the capacitive coupling electrode 23 and (b) the first capacitive electrode layer 21 and the second capacitive electrode layer 22, and the capacitive coupling electrode 23 is opposed to the first capacitive electrode layer 21 and the second capacitive electrode layer 22, so as to form a capacitor and to capacitively couple the plurality of resonators 61 and 62. By appropriately adjusting a combination of the capacitance of this capacitor, and a coupling coefficient value of the magnetic coupling between the first viahole inductor conductor 31 and the second viahole inductor conductor 32, desired characteristics can be obtained. In this case, a distance between the first viahole inductor conductor 31 and the second viahole inductor conductor 32 is set to be smaller than 1.5 times the length of the first viahole inductor conductor 31.

Further, the multi-layered device is characterized by including an inductor electrode layer 33 which is connected between another end of the first viahole inductor conductor 31 and the side-surface ground electrode 13, and arranged substantially in parallel to the dielectric sheet layer 4. By providing the inductor electrode layer 33 arranged substantially in parallel to the dielectric sheet layer 4, it is possible to shorten the length of the first viahole inductor conductor 31. As a result, it is possible to suppress the magnetic coupling between the first viahole inductor conductor 31 and the second viahole inductor conductor 32 even when the first viahole inductor conductor 31 and the second viahole inductor conductor 32 are moved closer to each other.

Figure 3:
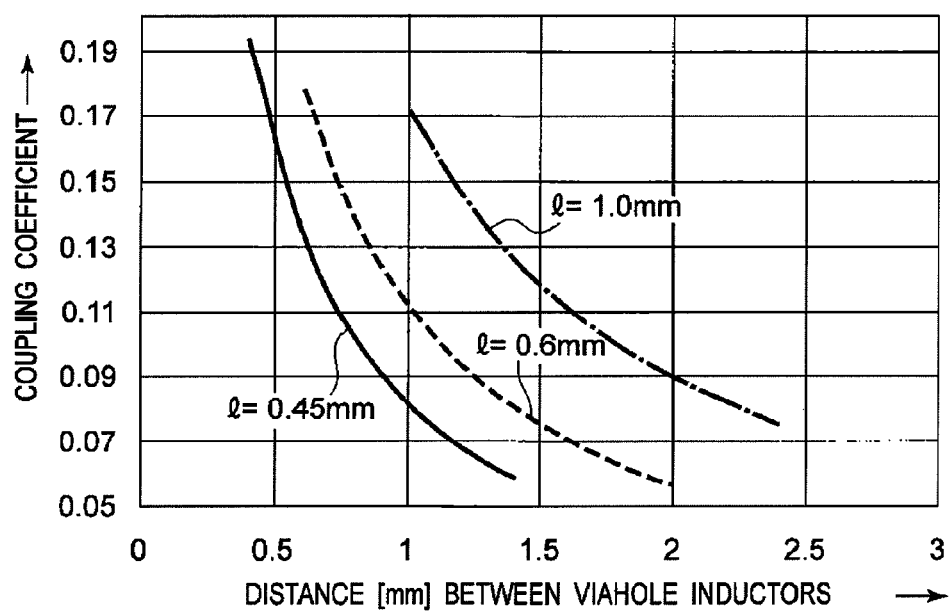
FIG. 3 is a graph showing a relation between a distance between viahole inductor conductors and a coupling coefficient of magnetic coupling of FIGS. 1 and 2.

FIG. 3 is a graph showing calculation results of the relation between (a) the distance between the first viahole inductor conductor 31 and the second viahole inductor conductor 32 and (b) the coupling coefficient, calculated using the above Equations (1) and (2) in a case where the length of the first viahole inductor conductor 31 and the length of the second viahole inductor conductor 32 are the same as each other. Each of the radiuses of the conductors was set to 0.05 mm. The solid line shows calculation results obtained when the length of the inductor conductors were set to 0.45 mm, the dashed line shows calculation results obtained when the length of the inductor conductors were set to 0.6 mm, and the chain line shows calculation results obtained when the length of the inductor conductors were set to 1.0 mm. It can be understood that a distance of about 1.5 times the length of the first viahole inductor conductor 31 is required to suppress the coupling coefficient to equal to or smaller than 0.11. Conversely speaking, when it is tried to perform designing with a distance equal to or smaller than 1.5 times the length of the first viahole inductor conductor 31, the mechanism for suppressing the magnetic coupling as described above is required.

When a center-to-center distance between (a) a linear conductor having a radius "a" and a length "$l_1$", and (b) a linear conductor having a radius "a" and a length "$l_2$" is "d", a mutual inductance can be obtained by the following Equation (3).

$$M = \frac{\mu_0}{4\pi} \begin{pmatrix} (l_2\log(l_2 + \sqrt{d^2 + l_2^2}) - \sqrt{d^2 + l_2^2} + d - \\ (l_2 - l_2)\log(l_2 - l_1 + \sqrt{d^2 + (l_2 - l_1)^2}) - \\ \sqrt{2^2 + (l_2 - l_1)^2} \\ -l_1\log(-l_1 + \sqrt{d^2 + l_1^2}) - \sqrt{d^2 + l_1^2} \end{pmatrix} \quad (3)$$

It is noted that self-inductances of the respective linear conductors can be obtained by the above Equation (1).

The length of the present second viahole inductor conductor 32 was set to 0.442 mm, and the length of the first viahole inductor conductor 31 was set to 0.22 mm. Each of the radiuses of the first and second viahole inductor conductors 31 and 32 was set to 40 μm. In addition, in pursuit of further size reduction, the distance between the viahole inductor conductors 31 and 32 was set to 0.4 mm, which is an interval narrower than the thickness of the insulator 51. In this case, a self-inductance L3 of the first viahole inductor conductor 31 and a self-inductance L4 of the second viahole inductor conductor 32 can be obtained by the Equation (1), and the inductance L3 becomes 0.0978 nH, and the inductance L4 becomes 0.2381 nH. In this case, the mutual inductance M2 of the respective viahole inductor conductors 31 and 32 becomes 0.0224 nH according to the Equation (3).

When the length and the shape of the inductor electrode layer 33 are adjusted so that a total inductance of the first viahole inductor conductor 31 and the inductor electrode layer 33 becomes a value the same as the inductance constituted of the second viahole inductor conductor 32, the inductance of each of the resonators 61 and 62 becomes 0.2381 nH, and the mutual inductance between the viahole inductor conductors 31 and 32 becomes M2 obtained as described above. Therefore, the coupling coefficient between the resonators 61 and 62 becomes 0.094 as a result. This is because the inductor electrode layer 33 and the second viahole inductor conductor 32 are perpendicular to each other, and therefore, it scarcely contributes to the magnetic coupling.

An actual three-dimensional model was produced by reflecting the shapes and arrangements of the first and second viahole inductor conductors 31 and 32, and subjected to simulations by means of a three-dimensional electromagnetic field simulator for a trial design.

The material described in the specification of the International Publication No. WO 2006/109465 A1 was used as the material of the dielectric sheet 1. The material is a low-temperature sintered ceramic material obtained by mixing an $xBaO-yNd_2O_3-zTiO_2-wBi_2O_3$ based dielectric filler with glass powder, and sintering the mixture at a low temperature of about 900 degrees. The material has a high Q value at high frequencies, and a Q value exceeds 1000 at the frequency range of 2.4 GHz to 2.5 GHz for wireless IAN. In addition, this material has a high dielectric constant of 57, and therefore, the capacitor can be formed compact.

Each electrode material is, for example, silver. Each electrode is formed by printing and multi-layering a paste of a resin, in which silver powder is dispersed, on each dielectric sheet. Each viahole is formed by opening a through hole through the dielectric sheet by laser beam machining or mechanical machining, and filling the through hole with a silver paste. By multi-layering these dielectric sheets and firing the dielectric sheets simultaneously, one multi-layered device as shown in FIG. 3 is obtained. When the above described ceramic material is used, the firing temperature is about 920 degrees, at which the sintering of silver can sufficiently be achieved, and therefore, a high electric conductivity of $4.7 \times 10^7$ can be obtained. In addition, since this temperature is lower than the melting point of silver, it is possible to obtain a stable shape with high dimensional accuracy.

In addition, a model was produced based on the above described configurations, and calculation was executed using three-dimensional electromagnetic field simulations.

Figure 4:
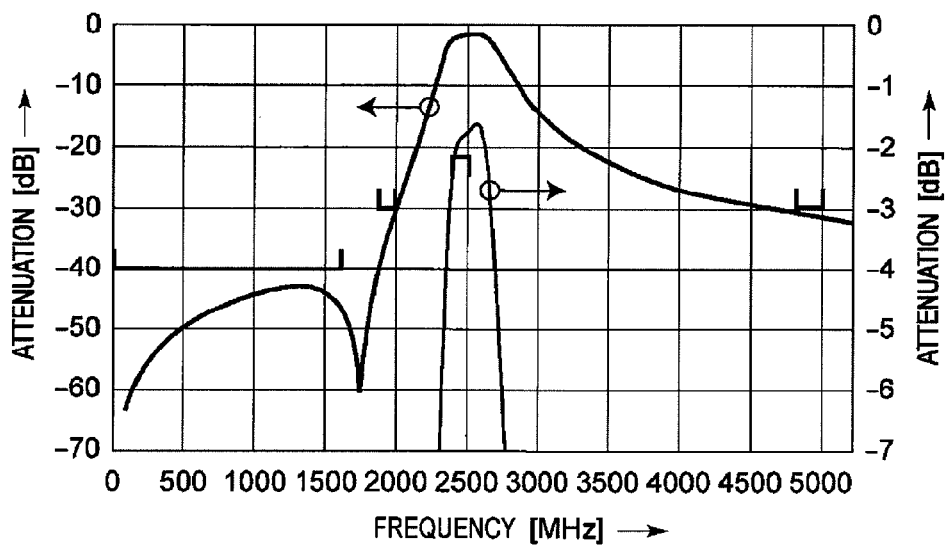
FIG. 4 is a graph showing characteristics of the multi-layered device according to the preferred embodiment of the present invention.

Since the distance between the viahole inductor conductors was suppressed to 0.4 mm in the above described configuration, the satisfactory characteristics of FIG. 4 could be obtained while finally achieving a size reduction to outline size of 0.8 mm×0.6 mm×0.5 mm.

Figure 11:
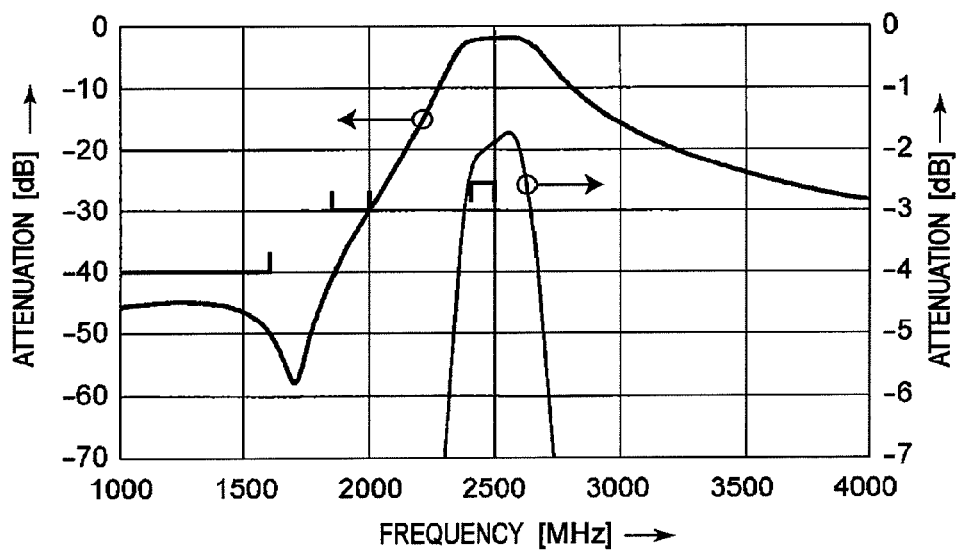
FIG. 11 is a graph showing characteristics of the multi-layered device according to the prior art.
Figure 12:
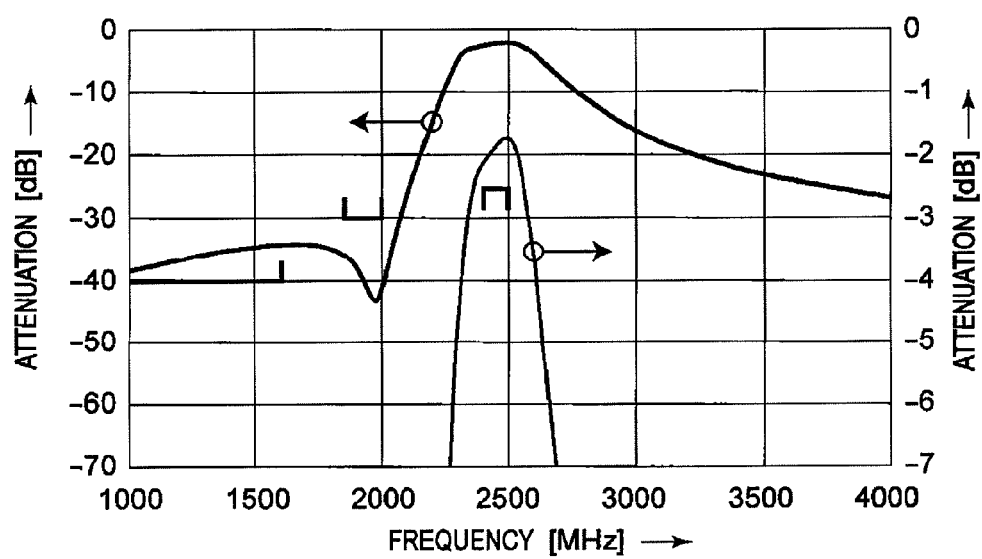
FIG. 12 is a graph showing characteristics of the multi-layered device according to the prior art.

An insertion loss becomes 2.13 dB, an attenuation becomes 30 dB at a frequency of 1990 MHz, and a minimum attenuation value of 43 dB at a frequency of equal to or lower than 1800 MHz were achieved. Namely, there could be obtained the characteristics almost equivalent to the characteristics of FIG. 11 obtained on the assumption that the distance between the viahole inductor conductors is 0.95 mm.

It is noted that the calculations based on the above theoretical formula are ideal ones, and the calculation results are shifted by about 10% in the majority of cases depending on positions in such a situation where the ground electrodes 11, 12, 13 and 14 are arranged about the periphery of the multi-layered device, as in the actual devices. Finally, the length of the first viahole inductor conductor 31 became 0.24 mm. Calculating back from the obtained characteristics, the inductance of the second viahole inductor conductor 32 was 0.2567 nH, the total inductance of the first viahole inductor conductor 31 and the inductor electrode layer 33 was 0.2569 nH, and the coupling coefficient was 0.095, namely, almost desired values were obtained.

In this implemental example, the length of the first viahole inductor conductor 31 became 54.3% of the length of the second viahole inductor conductor 32. As apparent from the results, the length of the first viahole inductor conductor 31 should be preferably equal to or smaller than 60% of the length of the second viahole inductor conductor 32.

Figure 5:
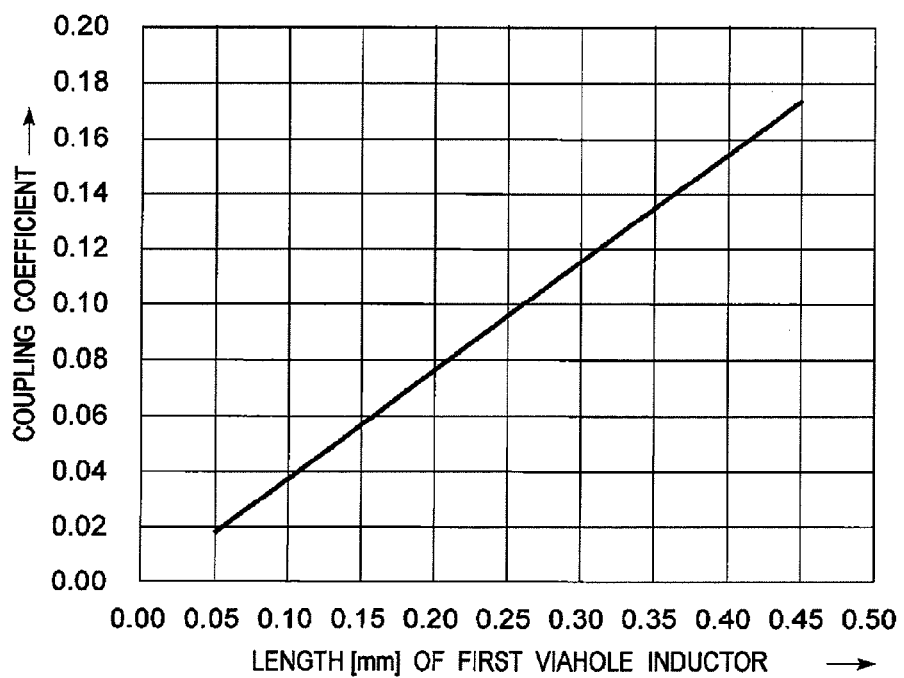
FIG. 5 is a graph showing a relation between a length of a first viahole inductor conductor and the coupling coefficient of the magnetic coupling of FIGS. 1 and 2.

FIG. 5 is a graph showing a relation between the length of the first viahole inductor conductor and the coupling coefficient between the resonators 61 and 62 when each of radiuses of the viahole inductor conductors 31 and 32 is set to 0.04 mm, the length of the second viahole inductor conductor 32 is set to 0.45 mm, and a distance between the first viahole inductor conductor 31 and the second viahole inductor conductor 32 is set to 0.45 mm, which is equal to the length of the second viahole inductor conductor 32. The mutual inductance between the viahole inductor conductors 31 and 32 was obtained by using the above Equation (3). In this case, it is assumed that the length of the inductor electrode layer 33 is adjusted so that the total inductance of the first viahole inductor conductor 31 and the inductor electrode layer 33 becomes the same as that of the second viahole inductor conductor 32 as the length of the first viahole inductor conductor 31 is changed. Therefore, the coupling coefficient of the magnetic coupling between the resonators 61 and 62 is obtained by dividing the mutual inductance between the viahole inductor conductors 31 and 32 by the self-inductance of the second viahole inductor conductor 32.

According to the above, it is possible to suppress the coupling coefficient between the resonators 61 and 62 to equal to or smaller than 0.11 by setting the length of the first viahole inductor conductor 31 to a value equal to or smaller than 0.27 mm.

Although depending on the circuit construction and the required specifications of the filter, in many cases, satisfactory characteristics can be obtained when the magnetic coupling between the resonators 61 and 62 is designed within a range of 0.03 to 0.11. Namely, by setting the length of the first viahole inductor conductor 31 to a value equal to or smaller than 60% of the length of the second viahole inductor conductor 32, the distance between them can roughly be close to the length of the second viahole inductor conductor 32.

Further, each of the radiuses of the first viahole inductor conductor 31 and the second viahole inductor conductor 32 is preferably equal to or larger than 40 μm. According to the above Equations (1) to (3), the self-inductance becomes larger by reducing the radius of the viahole inductor conductor. On the other hand, the mutual inductance has no relation to the radiuses of the viahole inductor conductors 31 and 32. Therefore, a reduction in the coupling coefficient between the resonators 61 and 62 can also be achieved by reducing the radiuses of the viahole inductor conductors 31 and 32. In addition, filter designing becomes easier as the inductance is larger. In addition, the dielectric sheet 4 is sandwiched between (a) the capacitive electrode layers 21 and 22 and (b) the ground electrode layer 12, so as to form a capacitor. However, since the capacitance can be reduced in inverse proportion to the inductances of the viahole inductor conductors 31 and 32, it is possible to reduce the areas of the capacitive electrode layers 21 and 22, and this facilitates a compact design. Therefore, it is advantageous also in this respect to reduce the radiuses of the viahole inductor conductors 31 and 32.

However, the Q value (the sharpness of resonance) of the resonators 61 and 62 significantly is deteriorated when the radiuses of the viahole inductor conductors 31 and 32 are reduced. By confirmation through actual simulations, the insertion loss increases and the performance conversely is deteriorated when the radiuses of the viahole inductor conductors 31 and 32 were smaller than 40 μm. In particular, the first viahole inductor conductor 31 is connected to the inductor electrode layer 33 substantially in parallel to the dielectric sheet layer, and the Q value disadvantageously reduces to about 70 percent as compared with the second viahole inductor conductor that has no such part. Therefore, as shown in the above implemental example, the radius of the first viahole inductor conductor 31 is preferably set to equal to or larger than 40 μm.

The upper limit is determined by the maximum value of the capacitance of the capacitor formed by the capacitive electrode layers 21 and 22, and the ground electrode layer 12. This is because the square root of the product of the capacitance and the inductance becomes the product of the center frequency of the filter and $2\pi$.

Further, at least one of the first viahole inductor conductor 31 and the second viahole inductor conductor 32 is arranged at a position substantially equidistant from the two side-surface ground electrodes 13 and 14.

In the above implemental example, distances from the first viahole inductor conductor 31 to the side-surface ground electrodes 13 and 14 are the same as each other. As the viahole inductor conductors 31 and 32 are arranged at the positions closer to the side-surface ground electrodes 13 and 14, the inductances of the viahole inductor conductors 31 and 32 become smaller. In addition, the Q values of the viahole inductor conductors 31 and 32 become smaller. Therefore, deterioration in characteristics can be prevented by separating them as far as possible. When the side-surface ground electrodes 13 and 14 are arranged on both of the side surfaces, the viahole inductor conductor is arranged at a position equidistant from both of the side-surface ground electrodes 13 and 14.

In addition, in order to prevent the deterioration in the Q value, the inductor electrode layer preferably has a shape of a single straight line.

Further, an angle between a straight line on which the inductor electrode layer 33 is formed and a plane on which the side-surface ground electrode 13 is formed preferably to be an acute angle. This is because, in order to prevent the deterioration in the Q value while achieving the desired inductance, it is possible to obtain a higher Q value when the inductance is adjusted by changing the angle with respect to the side-surface ground electrode 13 while keeping the shape of the single straight line, than when the inductance is adjusted by merely changing the position of the viahole inductor electrode 31 so as to change the distances from the viahole inductor electrode 31 to the side-surface ground electrodes 13 and 14.

Further, when it is considered to obtain a large inductance while shortening the first viahole inductor conductor 31, the inductor electrode layer 33 preferably has a folded shape including a part arranged in parallel to the side-surface ground electrode as shown in the above implemental example. The inductor electrode layer 33 should have a shape of a single straight line from the viewpoint of the Q value, however, a great merit can be obtained by forming the inductor electrode layer 33 to have the folded shape when it is considered to provide a more compact multi-layered device.

In addition, the manufacturing processes as described above are taken in actually manufacturing the multi-layered device. A plurality of patterns each having the above described size are arranged in a matrix on a large dielectric sheet of 50 mm×50 mm or 100 mm×100 mm, multi-layered collectively, and thereafter, cut into individual multi-layered devices. Since errors occur at the time of cutting, the length of the inductor electrode layer 33 varies in the above implemental example, and this leads to variations in the characteristics and reduced yield.

Figure 6:
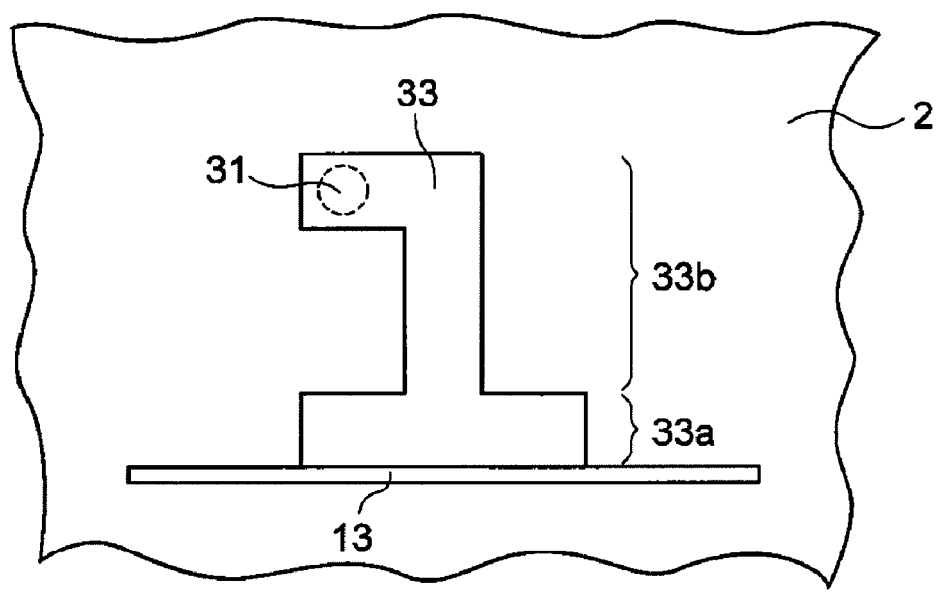
FIG. 6 is a top schematic view showing a structure of an inductor electrode layer of FIGS. 1 and 2.

Accordingly, as shown in the top schematic view of FIG. 6, the inductor electrode layer 33 preferably has a shape of two or more straight line shapes 33a and 33b having widths different from each other. For example, the width of the straight line shape 33a is set to 300 µm, and the width of the straight line shape 33b is set to 100 µm. The part 33a connected to the side-surface ground electrode is made thick as described above, and therefore, this part has a low impedance, and scarcely influences the inductance of the inductor electrode layer 33. Therefore, even when the variations occur in the length of the inductor electrode layer 33 due to the cutting offset, it does not influence the variations in the characteristics.

In addition, by constituting the inductor electrode layer 33 of two or more straight line shapes 33a and 33b having widths different from each other, the length of the straight line shape 33b can be adjusted by changing the length of the straight line shape 33a also in adjusting the inductance of the inductor electrode layer 33, and this facilitates the designing.

Figure 7:
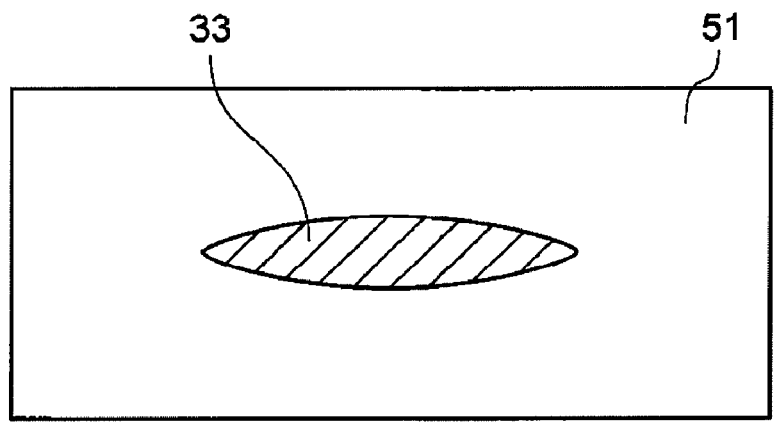
FIG. 7 is a sectional schematic view showing a cross-sectional shape of the electrode layer of FIGS. 1 and 2.

Further, a total thickness of the electrodes that constitute the inductor electrode layer 33 is preferably equal to or larger than 10 µm. The inductor electrode layer 33 had better has a thickness as large as possible since the Q value is reduced when the inductor electrode layer 33 is thin. Since the current concentrates on the surfaces and the edge parts of the inductor electrode layer 33 at frequencies of equal to or higher than 2 GHz, a thickness of 5 pin seems to be sufficient. However, since the multi-layered device is obtained by printing and multi-layering electrode patterns on a green sheet with silver paste, the cross-sectional shape of the inductor electrode layer 33 comes to have a shape as shown in FIG. 7 by pressure. Namely, the layer thickness at the end parts of the inductor electrode layer 33 becomes thinner than that at the center part, and therefore, the layer thickness of the inductor electrode layer 33 is required to be equal to or larger than 10 µm in order to obtain an appropriate Q value.

However, when the layer thickness of the inductor electrode layer 33 is increased, the difference in the level on the green sheet becomes larger, and this leads to deterioration in the stacking characteristics. Therefore, it is preferred to constitute the inductor electrode layer 33 of a plurality of electrode layers, and to reduce the total layer thickness thereof.

Figure 8:
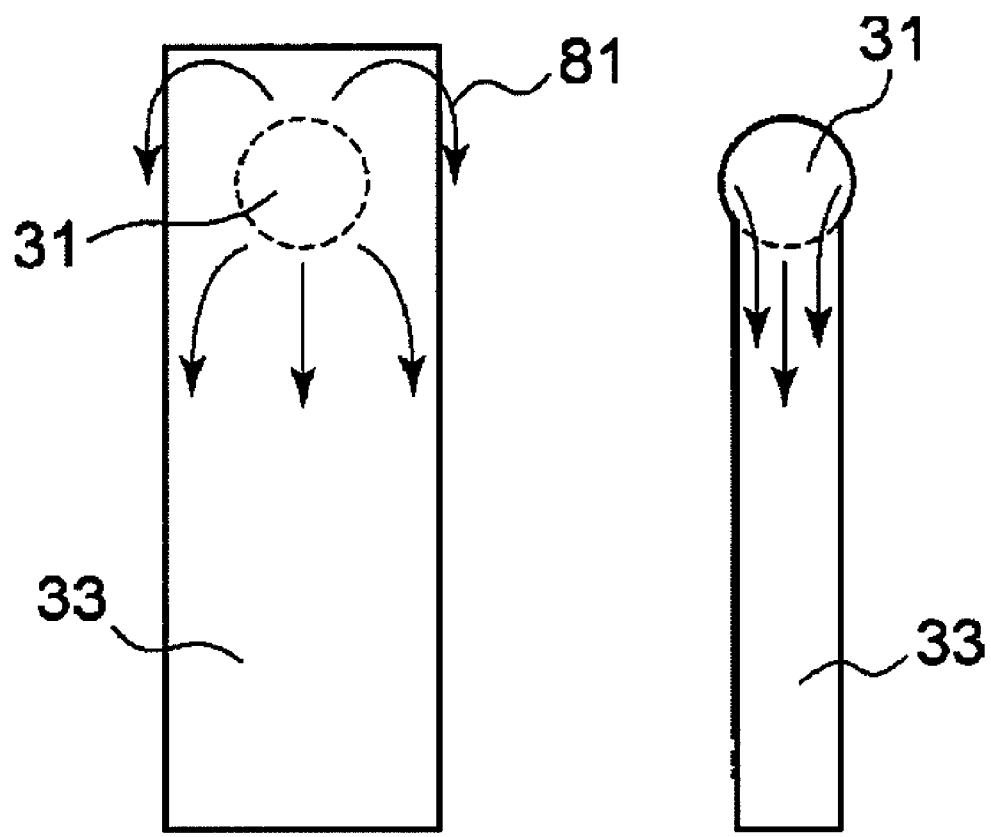
FIG. 8A is a schematic view showing a current flow in the inductor electrode layer of FIGS. 1 and 2.
FIG. 8B is a schematic view showing a current flow in the inductor electrode layer of FIGS. 1 and 2.
Figure 9:
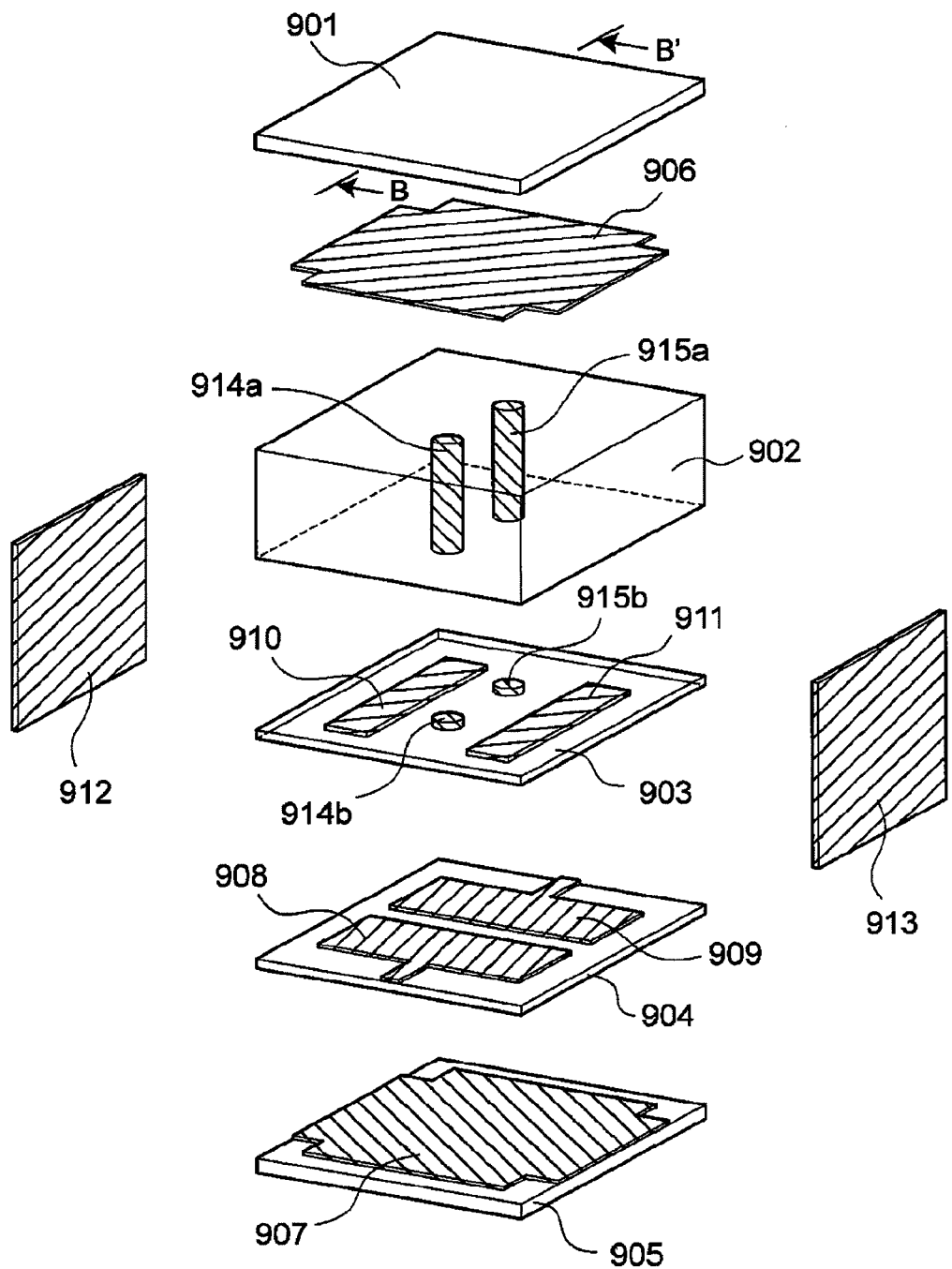
FIG. 9 is an exploded perspective view of a multi-layered device according to a prior art.
Figure 10:
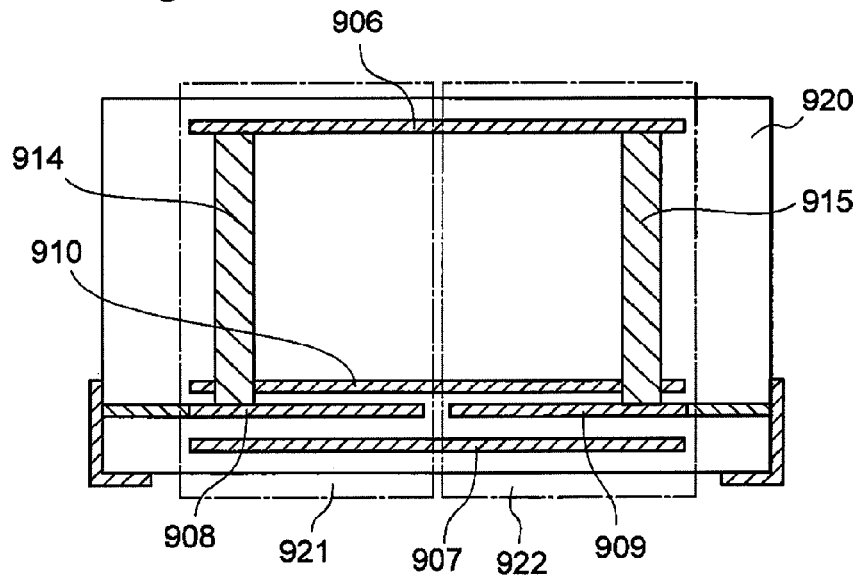
FIG. 10 is a sectional schematic view (a sectional view along a line B-B' of FIG. 9) of the multi-layered device according to the prior art.

In the above implemental example, the width of the inductor electrode layer 33 is set to 100 µm, which is larger than the diameter of the viahole inductor conductor 31. However, if the processes tolerate allow, the width of the inductor electrode 33 is preferred to be smaller than the diameter of the first viahole inductor conductor 31. FIG. 8A is a schematic view showing the current flow when the width of the inductor electrode layer 33 is larger than the diameter of the viahole inductor conductor 31, and FIG. 8B is a schematic view showing the current flow when the width of the inductor electrode layer 33 is smaller than the diameter of the viahole inductor conductor 31. As illustrated in the figures, by setting the width of the inductor electrode 33 to be smaller than the diameter of the first viahole inductor conductor 31, the current flows more smoothly at the connecting part of the first viahole inductor conductor 31 and the inductor electrode layer 33, and therefore, the Q value is improved.

In this case, it is noted that the thickness of the inductor electrode layer 33 is required to be thickened because the width thereof is narrowed. For example, the width of the inductor electrode layer 33 is set to 50 µm, and the thickness of the inductor electrode layer 33 is set to 40 µm. Since the cross-sectional area is doubled as compared with that of the above described example with the width of 100 µm and the thickness of 10 µm, there is such a merit that the Q value is improved and the insertion loss is reduced. Printing in such a shape can be achieved by using the processes disclosed in, for example, the Japanese patent laid-open publication No. 2007-123678-A. In addition, the printing can also be achieved by a method of preliminary forming an electrode of such a shape by soldering or the like, and then transferring the formed electrode onto the green sheet.

By connecting a signal processing circuit or the like to the multi-layered device, it is possible to size and height of a resultant electric equipment.

As described in detail above, according to the multi-layered device according to the present invention, the length of the first viahole inductor conductor can be shortened by providing the inductor electrode layer arranged substantially in parallel to the dielectric sheet layer, and, as a result, it is possible to suppress the magnetic coupling between the first and second viahole inductor conductors.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A multi-layered device comprising:
an insulator including a plurality of multi-layered dielectric sheet layers;
a ground electrode layer arranged substantially in parallel to the dielectric sheet layers in a location of one of an inside part of the insulator layer and a surface of the insulator;
side-surface ground electrodes arranged on side surfaces of the insulator; and
a plurality of resonators formed in the insulator, the resonators including first and second resonators,
wherein the first resonator comprises:
a first capacitive electrode layer arranged substantially in parallel to the dielectric sheet layers; and
a first viahole inductor conductor which has one end connected to the first capacitive electrode layer and is arranged to be substantially perpendicular to the dielectric sheet layers,
wherein the second resonator comprises:
a second capacitive electrode layer arranged substantially in parallel to the dielectric sheet layers; and
a second viahole inductor conductor which has one end connected to the second capacitive electrode layer and is arranged to be substantially perpendicular to the dielectric sheet layers,
wherein the first and second viahole inductor conductors are arranged in such a positional relation that a distance between the first and second viahole inductor conductors is smaller than 1.5 times a length of the first viahole inductor conductor, and
wherein the multi-layered device includes an inductor electrode layer connected between another end of the first viahole inductor conductor and the side-surface ground electrode and arranged substantially in parallel to the dielectric sheet layers.

2. The multi-layered device as claimed in claim 1, wherein the length of the first viahole inductor conductor is equal to or smaller than 60% of a length of the second viahole inductor conductor.

3. The multi-layered device as claimed in claim 1, wherein each of the first and second viahole inductor conductors has a radius of equal to or larger than 40 µm.

4. The multi-layered device as claimed in claim 1,
wherein the inductor electrode layer has a shape of two or more straight lines having widths different from each other.

5. The multi-layered device as claimed in claim 1,
wherein a total thickness of electrodes constituting the inductor electrode layer is equal to or larger than 10 μm.

6. The multi-layered device as claimed in claim 1,
wherein the inductor electrode layer comprises a plurality of electrode layers.

7. The multi-layered device as claimed in claim 1,
wherein a width of the inductor electrode is smaller than a diameter of the first viahole inductor conductor.

8. The multi-layered device as claimed in claim 1,
wherein the side-surface ground electrodes are arranged on opposite side surfaces of the insulator, respectively, and
wherein at least one of the first and second viahole inductor conductors is arranged at a position equidistant from two of the side-surface ground electrodes.

9. The multi-layered device as claimed in claim 8,
wherein the inductor electrode layer has a folded shape including a part arranged in parallel to the side-surface ground electrode.

10. The multi-layered device as claimed in claim 1,
wherein the inductor electrode layer has a shape of a single straight line.

11. The multi-layered device as claimed in claim 10,
wherein an angle between a straight line on which the inductor electrode layer is formed and a plane on which the side-surface ground electrode is formed is an acute angle.

12. An electronic equipment comprising:
a multi-layered device; and
a signal processing circuit connected to the multi-layered device,
wherein the multi-layered device comprises:
an insulator including a plurality of multi-layered dielectric sheet layers;
a ground electrode layer arranged substantially in parallel to the dielectric sheet layers in a location of one of an inside part of the insulator layer and a surface of the insulator;
side-surface ground electrodes arranged on side surfaces of the insulator; and
a plurality of resonators formed in the insulator, the resonators including first and second resonators,
wherein the first resonator comprises:
a first capacitive electrode layer arranged substantially in parallel to the dielectric sheet layers; and
a first viahole inductor conductor which has one end connected to the first capacitive electrode layer and is arranged to be substantially perpendicular to the dielectric sheet layers,
wherein the second resonator comprises:
a second capacitive electrode layer arranged substantially in parallel to the dielectric sheet layers; and
a second viahole inductor conductor which has one end connected to the second capacitive electrode layer and is arranged to be substantially perpendicular to the dielectric sheet layers,
wherein the first and second viahole inductor conductors are arranged in such a positional relation that a distance between the first and second viahole inductor conductors is smaller than 1.5 times a length of the first viahole inductor conductor, and
wherein the multi-layered device includes an inductor electrode layer connected between another end of the first viahole inductor conductor and the side-surface ground electrode and arranged substantially in parallel to the dielectric sheet layers.

\* \* \* \* \*